United States Patent
Park et al.

(10) Patent No.: US 10,975,494 B2
(45) Date of Patent: Apr. 13, 2021

(54) INGOT GROWTH CONTROL DEVICE AND CONTROL METHOD THEREOF

(71) Applicant: SK SILTRON CO., LTD., Gumi-si (KR)

(72) Inventors: Hyun Woo Park, Gumi-si (KR); Se Hun Kim, Gumi-si (KR)

(73) Assignee: SK Siltron Co., Ltd.

( * ) Notice: Subject to any disclaimer, the term of this patent is extended or adjusted under 35 U.S.C. 154(b) by 44 days.

(21) Appl. No.: 16/467,001

(22) PCT Filed: May 30, 2017

(86) PCT No.: PCT/KR2017/005635
§ 371 (c)(1),
(2) Date: Jun. 5, 2019

(87) PCT Pub. No.: WO2018/105827
PCT Pub. Date: Jun. 14, 2018

(65) Prior Publication Data
US 2019/0390364 A1 Dec. 26, 2019

(30) Foreign Application Priority Data
Dec. 7, 2016 (KR) ........................ 10-2016-0165509

(51) Int. Cl.
*C30B 15/20* (2006.01)
*C30B 15/10* (2006.01)
*C30B 29/06* (2006.01)

(52) U.S. Cl.
CPC ............ *C30B 15/10* (2013.01); *C30B 15/203* (2013.01); *C30B 29/06* (2013.01)

(58) Field of Classification Search
CPC ......... C30B 15/00; C30B 15/02; C30B 15/20; C30B 15/203; C30B 15/26
See application file for complete search history.

(56) References Cited

U.S. PATENT DOCUMENTS 6,776,840 B1 * 8/2004 Fuerhoff ................ C30B 15/22
117/15
8,150,784 B2 * 4/2012 Bandoh ................. C30B 29/06
706/21
(Continued)

FOREIGN PATENT DOCUMENTS

| CN | 101377008 A | 3/2009 |
| CN | 102758250 A | 10/2012 |

(Continued)

OTHER PUBLICATIONS

Chinese Patent Office Action dated Aug. 21, 2020, issued in corresponding CN Application No. 201780076064.1, 5 pages.

*Primary Examiner* — Robert M Kunemund
(74) *Attorney, Agent, or Firm* — Lewis Roca Rothgerber Christie LLP

(57) ABSTRACT

The present invention relates to an ingot growth control device capable of quickly and accurately controlling a diameter of an ingot during an ingot growing process and improving quality of the ingot, and a control method thereof. In the ingot growth control device and a control method thereof according to the present invention, when an input unit provides diameter data obtained by filtering a diameter measurement value of an ingot, a diameter controller reflects the diameter data to control a pulling speed of the ingot, while a temperature controller reflects the diameter data to control power of a heater.

18 Claims, 6 Drawing Sheets

(56) References Cited

U.S. PATENT DOCUMENTS

| | | | |
|---|---|---|---|
| 2006/0130737 A1* | 6/2006 | Wakabayashi | ........ C30B 15/203 117/13 |
| 2009/0064923 A1 | 3/2009 | Takanashi | |
| 2010/0206219 A1* | 8/2010 | Orschel | .................. C30B 29/06 117/202 |
| 2010/0263585 A1 | 10/2010 | Hamada | |
| 2014/0360425 A1 | 12/2014 | Schroeck | |

FOREIGN PATENT DOCUMENTS

| | | |
|---|---|---|
| CN | 104233456 A | 12/2014 |
| JP | H01-96089 A | 4/1989 |
| JP | 2001019588 A | 1/2001 |
| JP | 2007045685 A | 2/2007 |
| JP | 2010248063 A | 11/2010 |
| KR | 1998-0009530 A | 4/1998 |
| KR | 2001-0080008 A | 8/2001 |
| KR | 10-2012-0065768 A | 6/2012 |
| KR | 10-2014-0090810 A | 7/2014 |
| KR | 10-2014-0095329 A | 8/2014 |
| KR | 10-2015-0036923 A | 4/2015 |
| KR | 10-2016-0025821 A | 3/2016 |
| KR | 20160025821 A | 3/2016 |

* cited by examiner

INGOT GROWTH CONTROL DEVICE AND CONTROL METHOD THEREOF

CROSS-REFERENCE TO RELATED APPLICATION(S)

This application is a U.S. National Phase Patent Application of International Application Number PCT/KR2017/005635, filed on May 30, 2017, which claims priority of Korean Patent Application Number 10-2016-0165509, filed on Dec. 7, 2016, the entire contents of all of which are incorporated herein by reference.

Technical Field

The present invention relates to an ingot growth control device capable of quickly and accurately controlling a diameter of an ingot during an ingot growing process and improving quality of the ingot, and a control method thereof.

Background Art

In order to fabricate a wafer, a single crystal silicon should be grown in an ingot form, and quality of the wafer is directly affected by quality of a silicon ingot, and thus an advanced process control technology from the time of growing the single crystal ingot is required.

The Czochralski (CZ) crystal growth method is mainly used for growing a silicon single crystal ingot. An important factor that directly affects quality of a grown single crystal by using this method is known as V/G which is a ratio of a crystal growth speed (V) and a temperature gradient (G) at a solid-liquid interface. Therefore, it is important to control the V/G to a target trajectory value set over the entire zone of a crystal growth.

A control system according to the CZ method is basically configured to change an actual pulling speed to match a target pulling speed by a change amount read by a current diameter monitoring system and a calculation through a PID controller.

Normally, a basic principle is that a diameter (Dia) of an ingot is measured during a single crystal ingot growing process, and when there is a difference between the measured diameter (Dia) and a target diameter (T_Dia), a pulling speed (P/S) of the ingot is corrected to make the diameter (Dia) of the ingot close to a reference value.

Therefore, the ingot growth control system may be expressed by the pulling speed control according to a change in the diameter of the ingot.

Korean Laid-open Patent Publication No. 2013-0008175 discloses an ingot growth control device in which a high-resolution temperature controller corrects heater power in real time by reflecting an error between an average pulling speed calculated by a diameter controller and a target pulling speed input separately.

Korean Laid-Open Patent Publication No. 2014-0113175 discloses a temperature control device of an ingot growth device that a temperature automatic design controller considers quantitatively a pulling speed error ($\Delta P/S_0$) and an actual temperature profile (Act $ATC_0$) of a previous ingot growing process and an actual temperature profile (Act ATC1) of a current ingot growing process by reflecting an error between an average pulling speed calculated by a diameter controller and a target pulling speed input separately to automatically design a target temperature profile (Target ATC) of a current ingot growing process.

FIG. 1 is a configuration diagram illustrating an example of an ingot growth control device according to the related art.

As shown in FIG. 1, when the ingot growth control device according to the related art measures a diameter (Dia) of an ingot and inputs the measured diameter (Dia) and a target diameter (T_Dia) to an auto diameter controller 1, the auto diameter controller 1 controls the diameter of the ingot by outputting the measured diameter (Dia) and the target diameter (T_Dia) at an actual pulling speed (P/S) and controlling a pulling speed of the ingot.

Next, when an average pulling speed (Avg. P/S) obtained by averaging the actual pulling speeds from the auto diameter controller 1 is input to an auto growth controller 2, the auto growth controller 2 outputs a temperature correction amount.

Next, when the temperature correction amount is input from the auto growth controller 2 to an auto temperature controller 3, the auto temperature controller 3 outputs heater power to control power of a heater, thereby controlling quality of the ingot. As described above, even though the diameter (Dia) of the ingot is measured in order to control the diameter and the quality of the ingot, there is a problem that a response time required to control the diameter and the quality of the ingot actually increases because it takes several steps to reflect a diameter error ($\Delta Dia$) and to correct the power of the heater.

In addition, according to the related art, it takes about 1 to 5 minutes to control the diameter of the ingot by changing the pulling speed to reflect the diameter error of the ingot. On the other hand, even though the power of the heater is controlled to reflect the diameter error of the ingot, it takes about 20 minutes to affect the actual ingot.

Therefore, since a temperature environment further affects the ingot after the diameter of the ingot is controlled, the diameter and the quality of the ingot are overcorrected, and thus it is difficult to obtain a desired ingot diameter and quality.

DISCLOSURE

Technical Problem

The present invention is directed to solving the above described problems in the related art and providing an ingot growth control device capable of quickly and accurately controlling a diameter of an ingot during an ingot growing process and improving quality of the ingot, and a control method thereof.

Technical Solution

According to the present invention, there is provided an ingot growth control device for heating a raw material accommodated in a crucible in a melt state and growing an ingot from a melt accommodated in the crucible to a target diameter, including: an input unit for inputting diameter data of an ingot grown from the crucible; a diameter controller for controlling a pulling speed (P/S) of the ingot in consideration of a previously inputted target pulling speed (T_P/S) in order to reduce an error between diameter data provided by the input unit and a previously inputted target diameter (T_Dia); and a temperature controller for controlling heater power in consideration of a previously inputted target temperature (T_temp) in order to reduce the error between the diameter data provided by the input unit and the previously inputted target diameter (T_Dia).

In addition, according to the present invention, there is provided an ingot growth control method for heating a raw material accommodated in a crucible in a melt state and growing an ingot from a melt accommodated in the crucible to a target diameter, including: a first step of inputting diameter data of an ingot grown from the crucible; a second step of controlling a pulling speed (P/S) of the ingot in consideration of a previously inputted target pulling speed (T_P/S) in order to reduce an error between the diameter data provided in the first step and a previously inputted target diameter (T_Dia); and a third step of controlling heater power in consideration of a previously inputted target temperature (T_temp) in order to reduce an error between the diameter data provided in the first step and the previously inputted target diameter (T_Dia), and the second and third steps are performed simultaneously.

Advantageous Effects

In an ingot growth control device and a control method thereof according to the present invention, when an input unit provides diameter data obtained by filtering a diameter measurement value of an ingot, a diameter controller controls a pulling speed of the ingot by reflecting the diameter data, while a temperature controller controls power of a heater by reflecting the diameter data.

Accordingly, the pulling speed of the ingot and the power of the heater are controlled independently by the diameter controller and the temperature controller, thereby controlling the diameter and quality of the ingot quickly and accurately.

In addition, a dispersion of the diameter of the ingot may be improved, and a variation of the pulling speed for controlling the diameter of the ingot may be reduced, thereby improving a crystal quality level.

MODES OF THE INVENTION

Hereinafter, embodiments will be described in detail with reference to the accompanying drawings. However, the scope of the spirit of the present invention may be determined from the matters disclosed in the embodiments, and the spirit of the present invention of the embodiments include practical modifications such as addition, deletion, modification, and the like of components to the following proposed embodiments.

Figure 1:
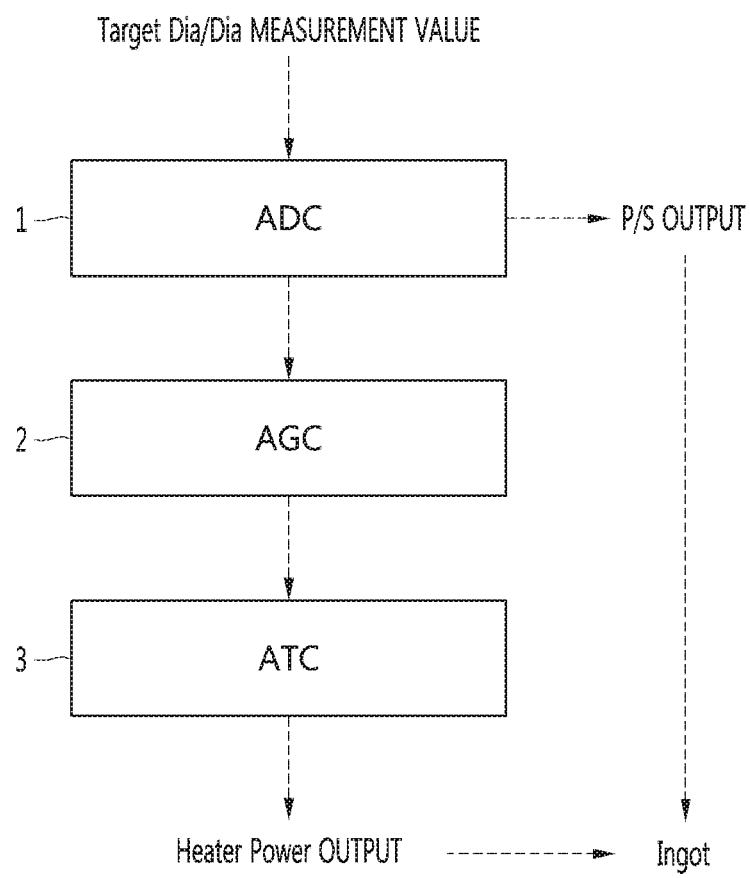
FIG. 1 is a configuration diagram illustrating an example of an ingot growth control device according to the related art.
Figure 2:
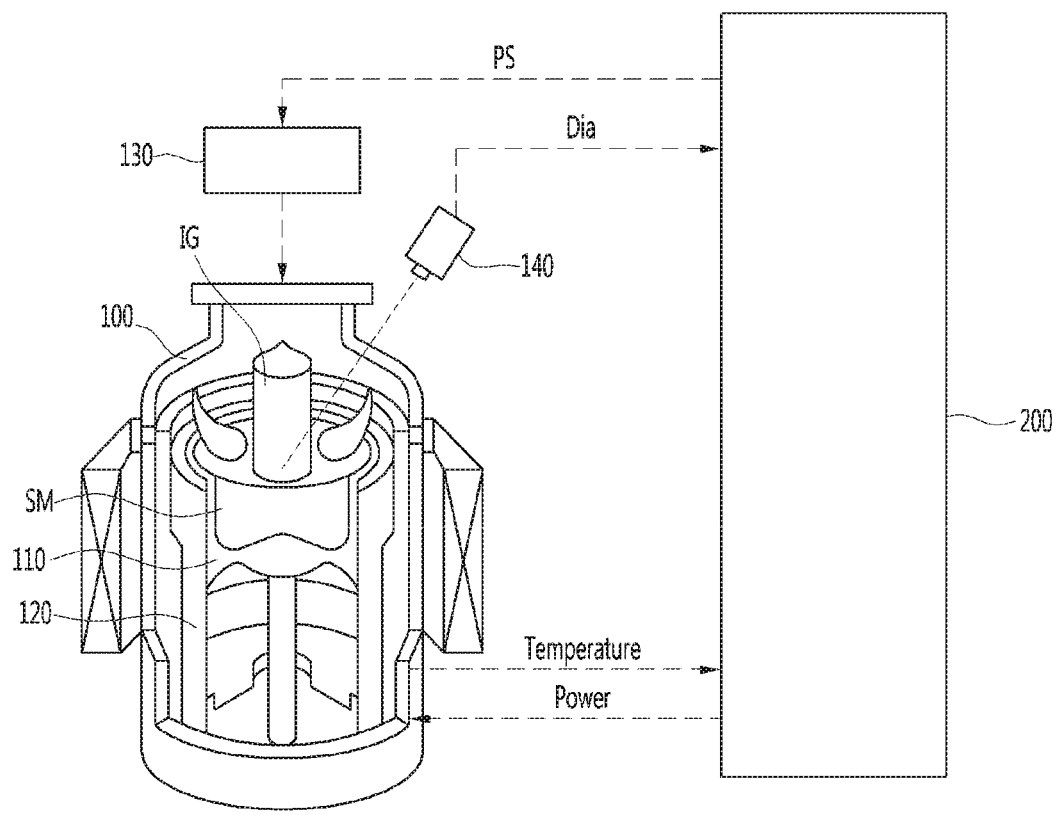
FIG. 2 is a view illustrating an ingot growth device according to the present invention.

FIG. 2 is a view illustrating an ingot growth device according to the present invention.

The ingot growth device of the present invention, as shown in FIG. 2, includes a crucible 110 accommodating a silicon melt (SM) for growing a single crystal silicon ingot (IG) in a chamber 100, a heater 120 for heating the crucible 110, a pulling device 130 for pulling while rotating the single crystal ingot (IG), a diameter measurement sensor 140 for measuring a diameter of the single crystal ingot (IG), and an ingot growth control device 200 for controlling the same.

In detail, the ingot growth control device 200 is configured to provide directly a pulling speed (P/S) for pulling up an ingot to the pulling device 130 and heater power which is power supplied to the heater 120.

At this time, the ingot growth control device 200 provides a diameter measured by the diameter measurement sensor 140 as diameter data (Dia data), and controls simultaneously the pulling speed (P/S) and the heater power in order to reduce an error between the diameter data (Dia data) and a previously inputted target diameter (T_Dia).

Of course, according to quality of the ingot, the target diameter (T_Dia), a target pulling speed (T_P/S), and a target temperature (T_temp) are inputted to the ingot growth control device 200 in advance, and the diameter (Dia), the pulling speed (P/S), and the heater power are controlled according to a target value.

Accordingly, the ingot growth control device 200 controls independently the ingot pulling speed (P/S) and the heater power by using the diameter data (Dia data), thereby controlling the diameter and the quality of the ingot quickly and accurately.

Figure 3:
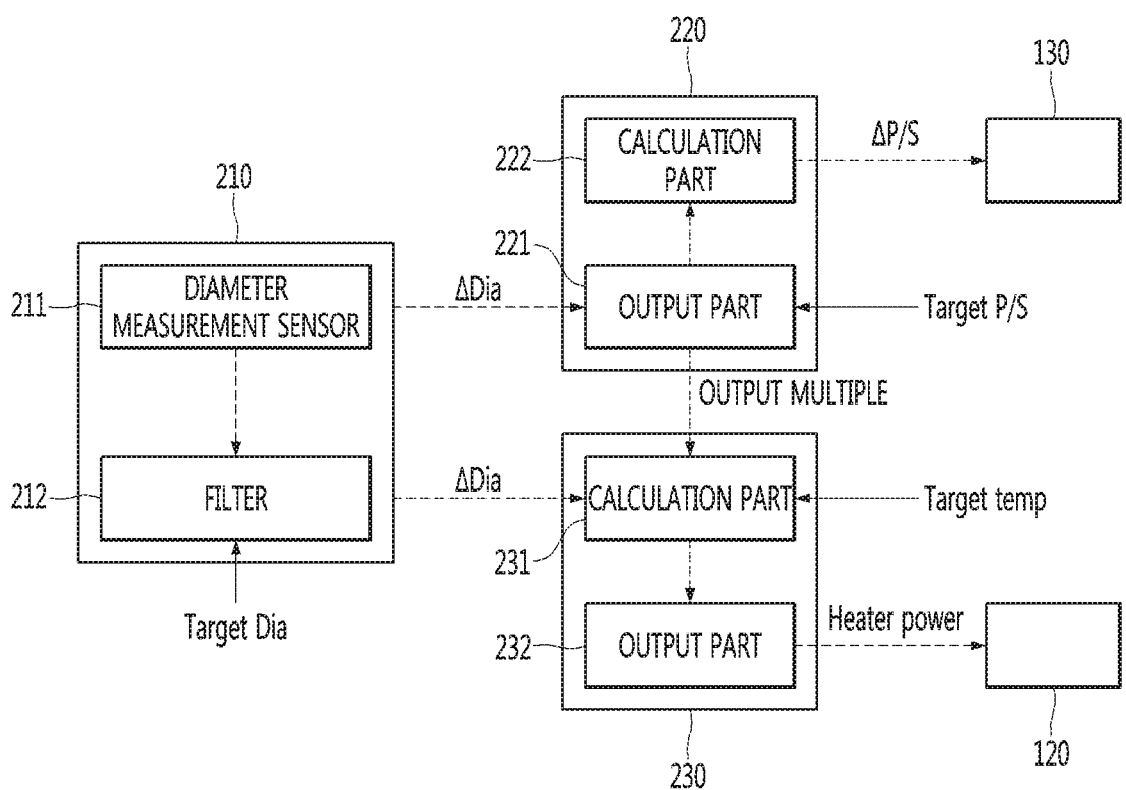
FIG. 3 is a configuration diagram illustrating an ingot growth control device applied to FIG. 2.

FIG. 3 is a configuration diagram illustrating an ingot growth control device applied to FIG. 2.

The growth control device of the present invention, as shown in FIG. 3, includes an input unit 210 for providing diameter data, a diameter controller 220 for controlling a pulling speed (P/S) in consideration of diameter data (Dia data) provided from the input unit 210, and a temperature controller for controlling heater power in consideration of the diameter data provided from the input unit 210.

The input unit 210 includes a diameter measurement sensor 211 for measuring a diameter of an ingot in an ingot growing process and a sensor filter 212 for processing a diameter measurement value measured by the diameter measurement sensor 211 into diameter data.

In detail, the diameter measurement sensor 211 may be configured as a kind of infrared camera or a CCD camera, and may measure the diameter of the ingot by measuring a position of a meniscus which is an interface between an ingot and a silicon melt, but is not limited thereto.

Of course, in the diameter measurement sensor 211, the diameter measurement value may be changed according to sensitivity of the sensor itself and an external noise, an installation position, and the like. In consideration of this, it is preferable that the diameter measurement value is calculated as the diameter data through a filtering process by the sensor filter 212 and is used for a control described below.

In addition, the sensor filter 212 includes a polynomial filter, an average filter, an actual filter, and a prediction filter, and in consideration of matters described in Table 1 below, one may be selected and applied according to the purpose of use.

TABLE 1

| Kinds | Input intensity reduction level | Output intensity reduction level | Node intensity reduction level | External noise reduction level | Response speed level |
|---|---|---|---|---|---|
| Polynomial filter | medium | medium | medium | large | medium |
| Average filter | large | large | large | large | slow |
| Actual filter | small | small | small | small | fast |
| Prediction filter | medium | medium | large | large | fast |

At this time, the polynomial filter may increase a response speed by calculating the diameter measurement value by using a polynomial equation and calculating the diameter data in accordance with the polynomial equation, as compared with the related art of calculating as the diameter data by reflecting the large trend of the diameter measurement value.

In addition, the prediction filter may increase the response speed by calculating a predicted diameter value of a single crystal ingot from which a noise reflecting a single crystal growth environment has been removed by using a correlation equation and calculating the diameter data according to the correlation equation, as the related art of calculating as the diameter data by reflecting the predicted value of the diameter measurement value.

Of course, the average filter goes through the process of averaging the diameter measurement values, and the actual filter uses the diameter measurement value as it is, and they are widely applied in the related art.

As described above, the input unit 210 measures the diameter of the ingot, and then appropriately filters and provides the diameter as the diameter data, thereby reducing the response speed and improving the reliability of the diameter data.

In addition, although the input unit 210 may provide the diameter data as it is, a diameter error (ΔDia) is calculated by comparing the diameter data with a previously input target diameter (T_Dia), and such a diameter error (ΔDia) may be provided to the diameter controller 220 and the temperature controller 230, but the present invention is not limited thereto.

The diameter controller 220 not only eliminates the diameter error (ΔDia) input from the input unit 210 but also controls the pulling speed (P/S) in accordance with the previously inputted target pulling speed (T_P/S), and includes a pulling speed calculation part 221 for calculating a pulling speed (P/S) in consideration of the diameter error (ΔDia) and the target pulling speed (T_P/S) and a pulling speed output part 222 for outputting the pulling speed (P/S) calculated by the pulling speed calculation part 221 to the pulling device 130.

In detail, the pulling speed calculation part 221 calculates the pulling speed (P/S) of the ingot according to input of the target pulling speed (T_P/S) through a pulling speed PID (Proportional, Integral, Differential) equation, wherein the pulling speed PID equation includes a function of a first delay time and a first reaction time, and the first delay time and the first reaction time are inputted in advance as a first delay set value and a first reaction set value separately.

In an embodiment, the pulling speed PID equation is constructed with a second order polynomial, and may include a sine function, but is not limited thereto.

However, the diameter controller 220 accumulates and stores a time from a time point (t0) when the pulling speed (P/S) of the ingot is output from the pulling speed output part 222 to a time point (t1) when a diameter of an actual ingot begins to be controlled thereby as first delay time data, and accumulates and stores a time from the time point (t1) when the diameter of the actual ingot begins to be controlled to a time point (t2) when the diameter of the actual ingot is controlled by about 63% of a final converging diameter as first reaction time data.

At this time, the pulling speed calculation part 221 compares the first delay time data accumulated and stored as described above with the first delay set value, and when the error occurs less than 10 times, the first delay set value is maintained as it is as the first delay time in the pulling speed PID equation, but when the error occurs 10 times or more, the accumulated and stored first delay time data is applied to the pulling speed PID equation as the first delay time.

In addition, the pulling speed calculation part 221 compares the first reaction time data accumulated as described above with the first reaction set value, and as described above, the first reaction set value is maintained as it is, or the first reaction time data is applied to the pulling speed PID equation as the first reaction time according to the number of occurrences of the error.

As described above, the diameter controller 220 controls the pulling speed (P/S) by using the pulling speed PID equation which is a function of the first delay time and the first reaction time, and the response speed of the diameter control according to the pulling speed may be increased by automatically optimizing the first delay time and the first reaction time to control the pulling speed (P/S).

The temperature controller 230 not only eliminates the diameter error (ΔDia) input from the input unit 210 but also controls heater power in accordance with the previously inputted target temperature (T_temp), and includes a heater power calculation part 231 for calculating the heat power in consideration of the diameter error (ΔDia) and the target temperature (T_temp) and a heater power output part 232 for outputting the heater power calculated by the heater power calculation part 231 to the heater 120.

In detail, the heater power calculation part 231 calculates the heater power according to an input of the target temperature (T_temp) through a heater power PID (Proportional, Integral, Differential) equation, wherein the heater power PID equation includes a function of a second delay time and a second reaction time, and the second delay time and the second reaction time are input previously as a second delay set value and a second reaction set value separately.

Likewise, the temperature controller 230, like the diameter controller 220, accumulates and stores a time from a time point (t0) when the heater power is output from the heater power output part 232 to a time point (t1) when the diameter of the actual ingot begins to be controlled thereby as second delay time data, and accumulates and stores a time from the time point (t1) when the diameter of the actual ingot begins to be controlled to a time point (t2) when the diameter of the actual ingot is controlled by about 63% of a final converging diameter as second reaction time data.

At this time, the heater power calculation part 231, like the pulling speed calculation part 221, compares the second delay time data and the second reaction time data that are accumulated and stored with the second delay time set value and the second reaction time set value that are set in advance, and as described above, the second delay set value and the second reaction set value are maintained as they are, or the second delay time data and the second reaction time data are applied to the heater power PID equation as the second delay time and the second reaction time according to the number of occurrences of the error.

As described above, the temperature controller 230 controls the heater power by using the heater power PID equation which is a function of the second delay time and the second reaction time, and the response time of the quality control according to the heater power may be increased by automatically optimizing the second delay time and the second reaction time to control the heater power.

However, the diameter controller 220 and the temperature controller 230 independently control the pulling speed and the heater power, but since a change in heat amount of the heater greatly affects a single crystal growth interface, it affects not only the quality of the ingot but also the diameter of the ingot.

Accordingly, when the pulling speed (P/S) of the ingot excessively deviates from a tolerance range of the target pulling speed (T_P/S), it is preferable to control the heater power in conjunction with the pulling speed (P/S) of the ingot. For this, the temperature controller 230 applies an output multiple proportional to the pulling speed error of the diameter controller 220 to the previously calculated heater power.

In an embodiment, when the pulling speed (P/S) of the single crystal ingot controlled by the diameter controller 220 deviates from an error range of 1 to 10% of the target pulling speed (T_P/S), the temperature controller 230 applies an output multiple to the previously calculated heater power, and the output multiple may be determined to be −100 times to +100 times so as to be proportional to a degree of deviation from an error range, but the present invention is not limited thereto.

Figure 4:
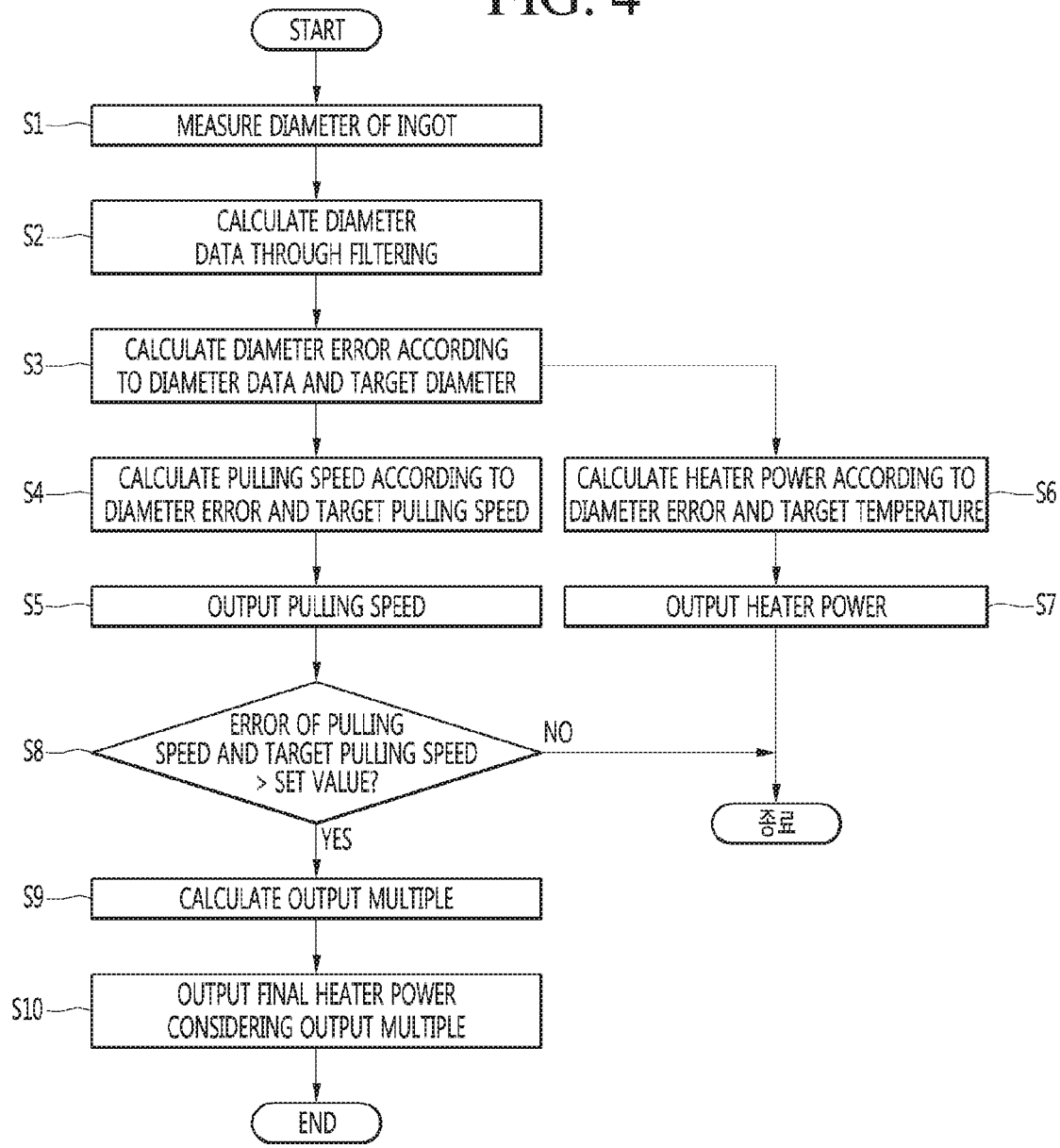
FIG. 4 is a flowchart illustrating an ingot growth control method according to the present invention.

FIG. 4 is a flowchart illustrating an ingot growth control method according to the present invention.

The ingot growth control method according to the present invention measures a diameter of an ingot as shown in FIG. 4, and calculates diameter data by filtering a diameter measurement value (see S1 and S2).

In an embodiment, the diameter of the ingot at a silicon melt interface may be measured by a diameter measurement sensor such as an infrared camera or a CCD camera.

In an embodiment, accuracy and reliability of the diameter data may be increased and simultaneously, a response speed may be increased by calculating a diameter measurement value as the diameter data by a sensor filter such as a polynomial filter or a prediction filter.

Next, a diameter error (ΔDia) according to the diameter data and a previously inputted target diameter (T_Dia) is calculated, and the diameter error (ΔDia) is provided for simultaneously controlling a pulling speed (P/S) and heater power (see S3).

Next, the pulling speed (P/S) is calculated and output according to the diameter error (ΔDia) and a target pulling speed (T_P/S) (see S4 and S5).

In an embodiment, the pulling speed (P/S) is controlled so as to match the target pulling speed (T_P/S) while eliminating the diameter error (ΔDia), and the pulling speed may be calculated by a pulling speed PID equation including a function of a first delay time and a first reaction time.

At this time, the first delay time is a time from a time point when the pulling speed (P/S) is outputted to a time point when a diameter of an actual ingot begins to be controlled, and the first reaction time is a time from the time point when the diameter of the ingot begins to be controlled to a time point when the diameter of the ingot reaches 63% of a final converging diameter of the ingot, and the first delay time and the first reaction time are input as previously set values.

In addition, the first delay time and the first reaction time may be accumulated and stored as real-time measurement values. When an error between the accumulated and stored value and the previously set value occurs at least ten times or more, the value is automatically updated to the accumulated and stored value, and thus the diameter of the ingot may be controlled quickly and accurately according to the pulling speed (P/S).

Meanwhile, the heater power is calculated and output according to the diameter error (ΔDia) and a target temperature (T_temp) (see S6 and S7).

In an embodiment, the heater power is controlled so as to match the target temperature (T_temp) while eliminating the diameter error (ΔDia), and the heater power may be calculated by a heater power PID equation including a function of a second delay time and a second reaction time.

At this time, the second delay time is a time from a time point when the heater power is outputted to a time point when a diameter of an actual ingot begins to be controlled, and the second reaction time is a time from the time point when the diameter of the ingot begins to be controlled to a time point when the diameter of the ingot reaches 63% of a final converging diameter of the ingot, and the second delay time and the second reaction time are input as previously set values.

In addition, the second delay time and the second reaction time may be accumulated and stored as real-time measurement values. When an error between the accumulated and stored value and the previously set value occurs at least ten times or more, the value is automatically updated to the accumulated and stored value, and thus the quality of the ingot may be controlled and simultaneously, the diameter of the ingot may be controlled quickly and accurately according to the heater power.

However, when the pulling speed (P/S) is excessively different from the target pulling speed (T_P/S), the heater power is controlled in conjunction with the pulling speed (P/S), and thus it is possible to quickly and accurately match the diameter of the ingot to the target diameter (T_Dia).

Therefore, when the error between the pulling speed (P/S) and the target pulling speed (T_P/S) deviates from a set range, an output multiple is calculated and the heater power is corrected in consideration of the output multiple, and then the output is finally output (see S8, S9, and S10).

In an embodiment, when the pulling speed (P/S) is out of a range of 1 to 10% of the target pulling speed (T_P/S), the output multiple is calculated within a range of −100 times to 100 times, and final heater power may be calculated by multiplying pre-calculated heater power by the output multiple.

Of course, when the error between the pulling speed (P/S) and the target pulling speed (T_P/S) is within the set range, the pre-calculated heater power is maintained.

Figure 5:
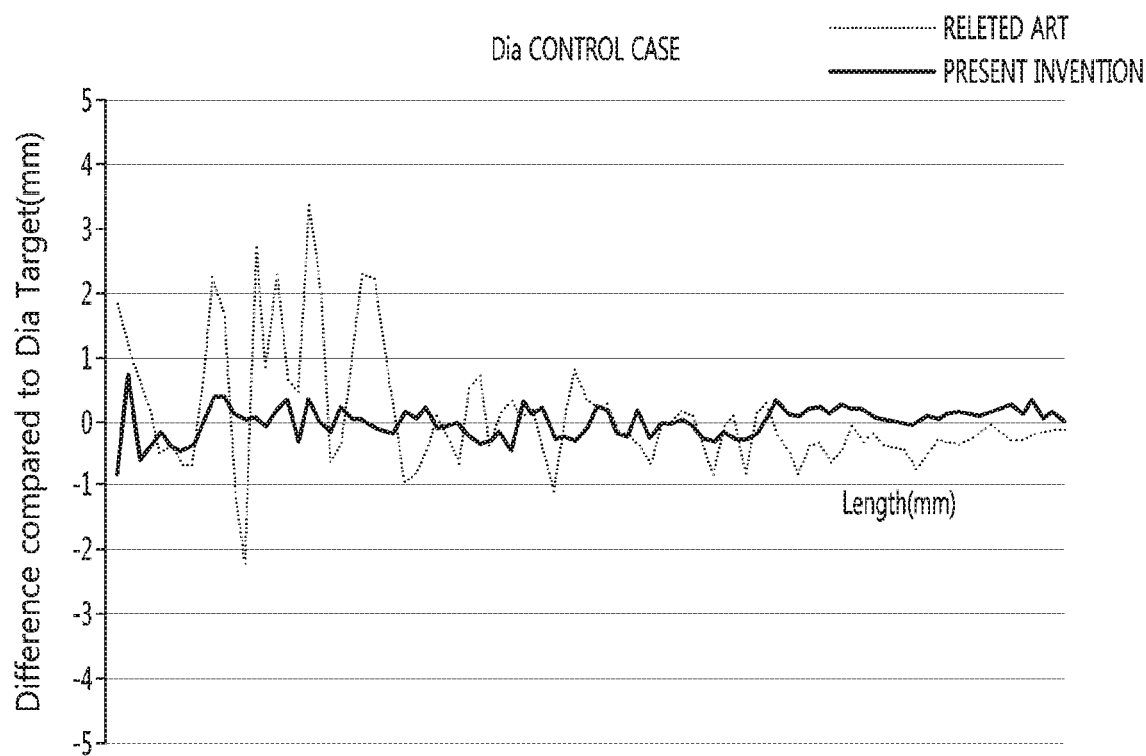
FIG. 5 is a graph illustrating a diameter of an ingot during a process according to the related art and the present invention.
Figure 6:
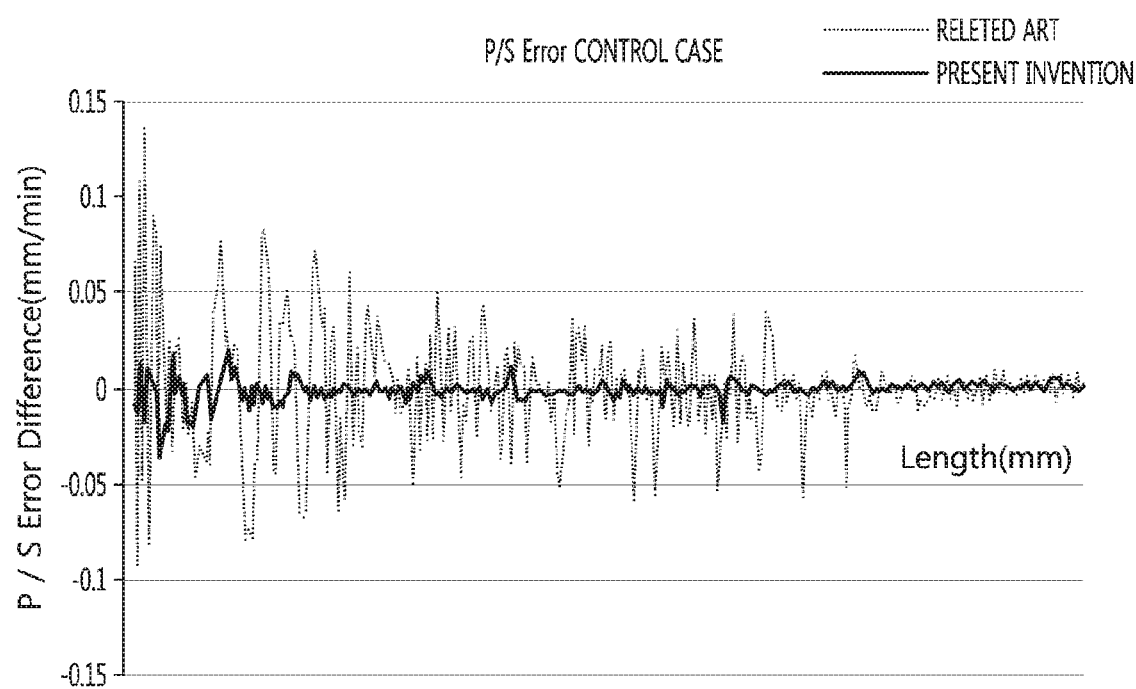
FIG. 6 is a graph illustrating an error of a pulling speed during a process according to the related art and the present invention.
Figure 7:
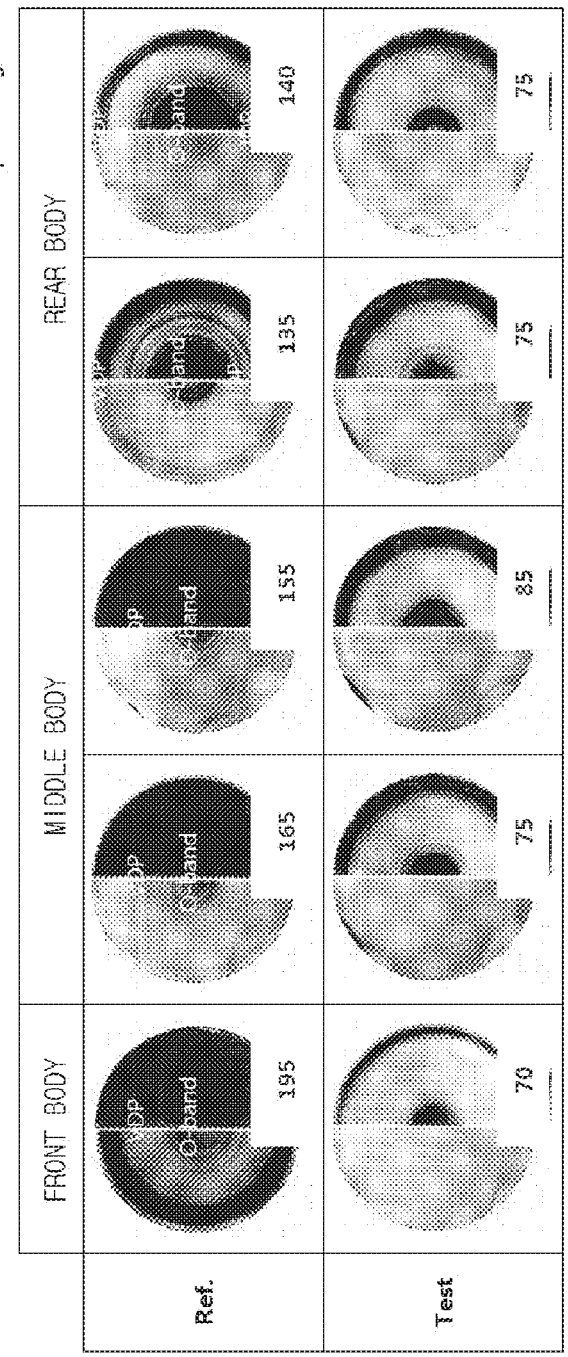
FIG. 7 is a view illustrating crystal quality results of an ingot grown according to the related art and the present invention.

FIGS. 5 and 6 are graphs illustrating a diameter of an ingot and an error of a pulling speed during a process according to the related art and the present invention, and FIG. 7 is a view illustrating crystal quality results of an ingot grown according to the related art and the present invention.

According to the related art, since the pulling speed is output as a diameter measurement value of the ingot is input to an auto diameter controller, and an average value of the pulling speed is output into heater power sequentially through an auto growth controller and an auto temperature controller, it takes a long time to output the heater power as compared with the pulling speed.

On the other hand, according to the present invention, since the diameter measurement value of the ingot is supplied to the diameter controller and the temperature controller simultaneously after being filtered at the input unit, and the pulling speed and the heater power are output independently from the diameter controller and the temperature controller, the pulling speed and the heater power are output almost simultaneously and quickly.

When the ingot is grown on the basis of the target diameter of 306 mm according to the related art and the present invention, a diameter deviation of the ingot grown according to the related art as shown in FIG. 5 is shown at an average of 0.84 mm, whereas the diameter deviation of the ingot grown according to the present invention is shown at an average of 0.31 mm, and it can be seen that the diameter deviation of the ingot is improved by about 63.3% as compared to the related art.

Therefore, since the ingot grown according to the present invention shows a small diameter deviation by position, productivity can be improved even though a back-end process such as grinding is not performed separately in order to eliminate the diameter deviation.

In addition, as shown in FIG. 6, an error of the pulling speed according to the related art is shown at an average of 0.034 mm/min, whereas an error of the pulling speed according to the present invention is shown at an average of 0.015 mm/min, and it can be seen that the error of the pulling speed is improved by about 56.8% as compared to the related art.

Therefore, a process according to the present invention significantly reduces the error of the pulling speed, so that the quality of the ingot may be uniformly improved for each length, and may be confirmed by a score of a copper haze scoring as shown in FIG. 7.

A copper haze evaluation method is an evaluation method in which copper is contaminated on one side of a wafer or a single crystal silicon piece at a high concentration by using a copper contamination solution which is a mixed solution of buffered oxide etchant (BOE) solution and copper, and short diffusion heat treatment is performed, and then the contaminated side or the opposite side of the contaminated side is observed with the naked eye under a condensing lamp, to distinguish a crystal defect region.

A cross section of a wafer or single crystal ingot may be divided into an O-band region, a vacancy dominant point defect zone (VDP) region, an interstitial dominant point defect zone (IDP) region, and a loop dominant point defect zone (LDP) region through a first heat treatment (BP) and a second heat treatment (BSW) by such a copper haze (Cu Hz) evaluation method.

In addition, the score of the copper haze scoring may be assigned to a region as described above by using the Cu Hz evaluation method, and the score of the copper haze scoring may be assigned from 0 to 300.

Recently, since a demand for quality of an ingot is high, the quality is controlled at a level in which only the VDP region and the IDP region, which are defect free regions where the O-band region is controlled, are shown over an entire zone of the ingot.

As shown in FIG. 7, an ingot manufactured according to the related art includes a lot of O-band regions with an average of 160 (O-band level)±40 pt level of a copper haze scoring score over the entire zone thereof, whereas an ingot manufactured according to the present invention is shown to include only an IDP region and a VDP region with an average of 80 (IDP/VDP level)±10 pt level of a copper haze scoring score over an entire zone thereof, and it can be seen that the quality of the ingot is significantly improved compared to the related art and the quality of the ingot is uniformly controlled over the entire zone.

INDUSTRIAL APPLICABILITY

The ingot growth control device and the control method thereof according to the present invention may control quickly and accurately the diameter of the ingot during the ingot growing process to the target diameter, and may improve the quality of the ingot.

The invention claimed is:

1. In an ingot growth control device for heating a raw material accommodated in a crucible in a melt state and growing an ingot from a melt accommodated in the crucible to a target diameter, the ingot growth control device comprising:
  an input unit for inputting diameter data of the ingot grown from the crucible;
  a diameter controller for controlling a pulling speed (P/S) of the ingot in consideration of a previously inputted target pulling speed (T_P/S) in order to reduce an error between diameter data provided by the input unit and a previously inputted target diameter (T_Dia); and
  a temperature controller for controlling heater power in consideration of a previously inputted target temperature (T_temp) in order to reduce the error between the diameter data provided by the input unit and the previously inputted target diameter (T_Dia),
  wherein the temperature controller includes a heater power calculation part for calculating heater power through a heater power PID (Proportional, Integral, Differential) equation including a function of a delay time and a reaction time and an output part for outputting the heater power calculated from the heater power calculation part, and
  wherein the temperature controller applies an output multiple to a previously calculated heater power, when a pulling speed (P/S) of the ingot controlled by the diameter controller deviates from a set range of the target pulling speed (T_P/S).

2. The ingot growth control device of claim 1, wherein the input unit includes a diameter measurement sensor for measuring a diameter of the ingot at an interface of melt accommodated in the crucible, and a sensor filter for processing a diameter measurement value measured by the diameter measurement sensor into diameter data.

3. The ingot growth control device of claim 2, wherein the sensor filter is a polynomial filter for calculating the diameter measurement value by using a polynomial equation and calculating diameter data in accordance with the polynomial equation.

4. The ingot growth control device of claim 2, wherein the sensor filter is a prediction filter that calculates a predicted diameter value of the ingot from which a noise reflecting a single crystal growth environment has been removed by using a correlation equation, and calculates diameter data according to the correlation equation.

5. The ingot growth control device of claim 1, wherein the diameter controller includes a pulling speed calculation part for calculating a pulling speed (P/S) of the ingot through a pulling speed PID (Proportional, Integral, Differential) equation including a function of a delay time and a reaction time, and
  a pulling speed output part for outputting the pulling speed (P/S) of the ingot calculated from the pulling speed calculation part.

6. The ingot growth control device of claim 5, wherein the diameter controller accumulates and stores a time from a time point (t0) when the pulling speed of the ingot is output from the pulling speed output part to a time point (t1) when a diameter of an actual ingot begins to be controlled thereby as delay time data, and the accumulated and stored delay time data is applied to the pulling speed PID equation as a delay time.

7. The ingot growth control device of claim 6, wherein the diameter controller accumulates and stores a time from the time point (t1) when the diameter of the actual ingot begins to be controlled to a time point (t2) when the diameter of the actual ingot is controlled by a predetermined percentage of a final converging diameter as reaction time data, and the accumulated and stored reaction time data is applied to the pulling speed PID equation as a reaction time.

8. The ingot growth control device of claim 1, wherein the temperature controller accumulates and stores a time from a time point (t0) when the heater power is output from the heater power output part to a time point (t1) when a diameter of an actual ingot begins to be controlled thereby as delay time data, and the accumulated and stored delay time data is applied to the heater power PID equation as a delay time.

9. The ingot growth control device of claim 8, wherein the temperature controller accumulates and stores a time from the time point (t1) when the diameter of the actual ingot begins to be controlled to a time point (t2) when the diameter of the actual ingot is controlled by a predetermined percentage of a final converging diameter as reaction time data, and the accumulated and stored reaction time data is applied to the heater power PID equation as a reaction time.

10. In an ingot growth control method for heating a raw material accommodated in a crucible in a melt state and growing an ingot from a melt accommodated in the crucible to a target diameter, the ingot growth control method comprising:

a first step of inputting diameter data of the ingot grown from the crucible;

a second step of controlling a pulling speed (P/S) of the ingot in consideration of a previously inputted target pulling speed (T_P/S) in order to reduce an error between the diameter data provided in the first step and a previously inputted target diameter (T_Dia); and a third step of controlling heater power in consideration of a previously inputted target temperature (T_temp) in order to reduce an error between the diameter data provided in the first step and the previously inputted target diameter (T_Dia), wherein the second and third steps are performed simultaneously, wherein the third step includes a first process for calculating heater power through a heater power PID (Proportional, Integral, Differential) equation including a function of a delay time and a reaction time and a second process for outputting the heater power calculated from the first process, and wherein the third step further include a process of applying an output multiple to a previously calculated heater power, when a pulling speed (P/S) of the ingot controlled in the second step deviates from a set range of the target pulling speed (T_P/S).

11. The ingot growth control method of claim 10, wherein the first step includes a first process for measuring a diameter of the ingot at an interface of melt accommodated in the crucible, and a second process for processing a diameter measurement value measured from the first process into diameter data.

12. The ingot growth control method of claim 11, wherein the second process calculates the diameter measurement value by using a polynomial equation, and calculates diameter data in accordance with the polynomial equation.

13. The ingot growth control method of claim 11, wherein the second process calculates a predicted diameter value of the ingot from which a noise reflecting a single crystal growth environment has been removed by using a correlation equation, and calculates diameter data according to the correlation equation.

14. The ingot growth control method of claim 10, wherein the second step includes a first process for calculating a pulling speed (P/S) of the ingot through a pulling speed PID (Proportional, Integral, Differential) equation including a function of a delay time and a reaction time, and a second process for outputting the pulling speed (P/S) of the ingot calculated from the first process.

15. The ingot growth control method of claim 14, wherein the second step further include a process of accumulating and storing a time from a time point (t0) when the pulling speed of the ingot is output from the second process to a time point (t1) when a diameter of an actual ingot begins to be controlled thereby as delay time data, and a process of applying the accumulated and stored delay time data to the pulling speed PID equation as a delay time.

16. The ingot growth control method of claim 15, wherein the second step further include a process of accumulating and storing a time from the time point (t1) when the diameter of the actual ingot begins to be controlled to a time point (t2) when the diameter of the actual ingot is controlled by a predetermined percentage of a final converging diameter as reaction time data, and a process of applying the accumulated and stored reaction time data to the pulling speed PID equation as a reaction time.

17. The ingot growth control method of claim 10, wherein the third step further include a process of accumulating and storing a time from a time point (t0) when the heater power is output from the second process to a time point (t1) when a diameter of an actual ingot begins to be controlled thereby as delay time data, and a process of applying the accumulated and stored delay time data to the heater power PID equation as a delay time.

18. The ingot growth control method of claim 17, wherein the third step further include a process of accumulating and storing a time from the time point (t1) when the diameter of the actual ingot begins to be controlled to a time point (t2) when the diameter of the actual ingot is controlled by a predetermined percentage of a final converging diameter as reaction time data, and a process of applying the accumulated and stored reaction time data to the heater power PID equation as a reaction time.

* * * * *